United States Patent [19]

Ishitani

[11] 4,072,975

[45] Feb. 7, 1978

[54] INSULATED GATE FIELD EFFECT TRANSISTOR

[75] Inventor: Akiyasu Ishitani, Atsugi, Japan

[73] Assignee: Sony Corporation, Tokyo, Japan

[21] Appl. No.: 790,089

[22] Filed: Apr. 22, 1977

[30] Foreign Application Priority Data

Apr. 29, 1976 Japan .................................. 51-48967

[51] Int. Cl.² ...................... H01L 29/78; H01L 27/02; H01L 29/06
[52] U.S. Cl. ........................................ 357/23; 357/41; 357/46; 357/55
[58] Field of Search .......................... 357/23, 41, 46, 55

[56] References Cited
U.S. PATENT DOCUMENTS 4,007,478  2/1977  Yagi ....................................... 357/23

Primary Examiner—Edward J. Wojciechowicz
Attorney, Agent, or Firm—Hill, Gross, Simpson, Van Santen, Steadman, Chiara & Simpson

[57] ABSTRACT

An insulated gate field effect transistor is formed of a drain region of a first conductivity type which faces both of the major surfaces of a semiconductor substrate, a frame region of a second conductivity type which faces the one major surface of the semiconductor substrate, a base region of the second conductivity type which faces the one major surface and is connected to the frame region, a PN junction being formed between the base region and the drain region, and a source region of the first conductivity type which faces the one major surface and is formed in the base region as if being surrounded thereby.

The insulated gate field effect transistor is also provided with a source electrode which short-circuits the frame region and the source region, a drain electrode which is provided on the drain region facing the other major surface of the substrate, and a gate electrode which is provided on the base region facing the one major surface through a gate insulating layer.

4 Claims, 19 Drawing Figures

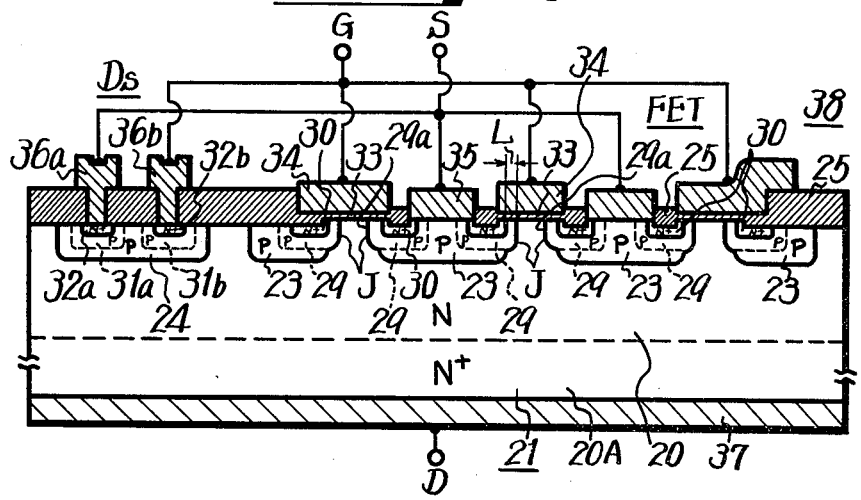
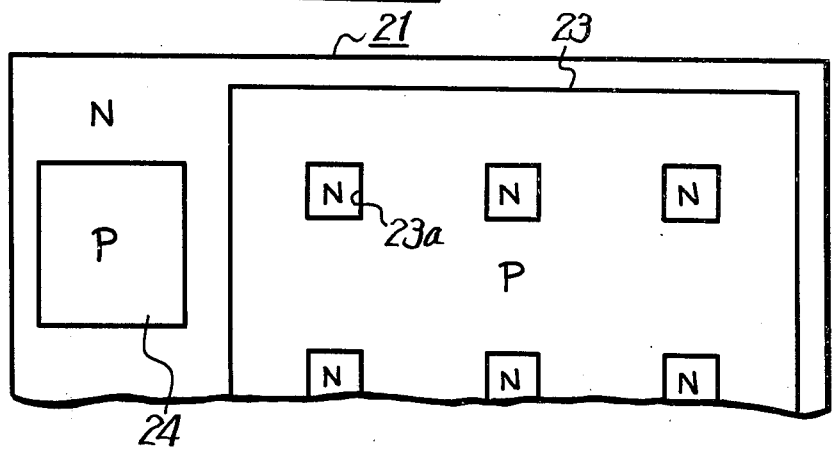
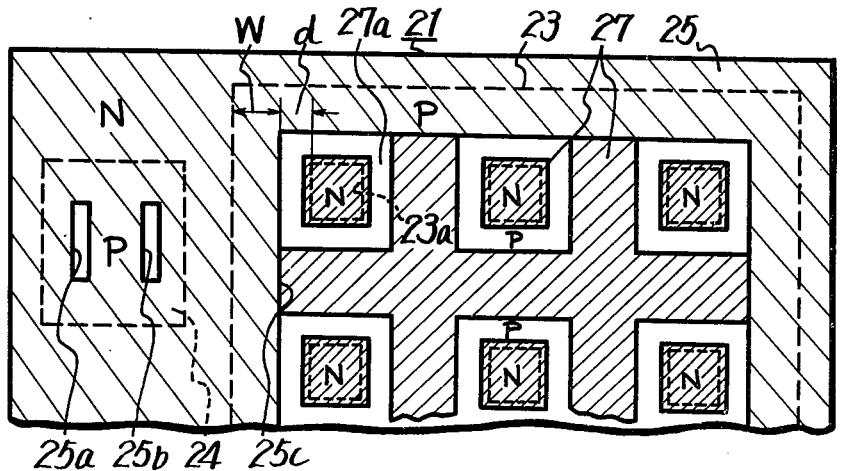

INSULATED GATE FIELD EFFECT TRANSISTOR

BACKGROUND OF THE INVENTION

1. Field of the Invention

The present invention relates to an insulated gate field effect transistor (hereinafter referred to as a MIS-FET).

2. Description of the Prior Art

Recently, attention has been given to a power MIS-FET. The power MIS-FET has characteristics such that no thermal runaway appears becaus of negative temperature coefficient of drain current, input impedance is high, switching can be performed at high speed and enhancement mode is easily obtainable.

A double diffused vertical-type construction has been applied for the power MIS-FET. In this construction, the drain region is formed by a semiconductor substrate so that current density per unit area can be easily increased.

A shown in FIG. 1, the double diffused vertical-type MIS-FET is formed of an N-type semiconductor substrate 1 serving as a drain region, a P-type base region or a channel forming region 2 which is formed by a selective diffusion process and faced to one major surface $1a$ o the semiconductor substrate 1, and an N-type source region 3 which is selectively formed on the base region 2 by, for example, a selective diffusion process. Then, a V-shaped groove 5 is formed by etching or the like from the major surface $1a$ side of the substrate 1 penetrating through the source region 3 and the base region 2. The V-shaped groove 5 has deposited therein a gate insulating layer 6 on which is deposited a gate electrode 7. Meanwhile, facing the other major surface $1b$ of the substrate 1 serving as the drain region 4 there is provided a high concentration region 4A from which a drain terminal D is led out. Reference numeral 8 designates a source electrode deposited extending over the source region 3 and base region 2, and S and G indicate a source terminal and a gate terminal.

In the MIS-FET as described above, a channel 9 is formed in the base region 2 at its portion in contact with the gate insulating layer 6 deposited in the etched groove 5. In this case, the channel length, that is, the distance between the source and drain regions 3 and 4 with the channel 9 interposed therebetween is defined by the difference between the diffused depths of the base region 2 and source region 3. Therefore, a quite small channel length can be obtained by properly selecting the diffused depths of the regions 2 and 3.

In the MIS-FET having such a construction, however, there are drawbacks such that the process for forming the groove 5 is quite troublesome and also it is difficult to reproduce MIS-FETs with uniform characteristics.

OBJECTS AND SUMMARY OF THE INVENTION

Accordingly, it is an object of this invention to provide an insulated gate field effect transistor which is free from the above drawbacks.

It is another object of this invention to provide an insulated gate field effect transistor in which gate-protecting reverse-connected diodes can be formed together with the formation of MIS-FET.

It is a further object of this invention to provide an insulated gate field effect transistor in which a frame region is formed to prevent the source and drain regions from being short-circuited.

According to an aspect of this invention, there is provided an insulated gate field effect transistor having a drain region of a first conductivity type facing both of the major surfaces of a semiconductor substrate, a frame region of a second conductivity type facing the one major surface and connected to the frame region, a PN junction being formed between this base region and the drain region, a source region of the first conductivity type facing the one major surface and formed in the base region as if being surrounded thereby, a source electrode which short-circuits the frame region and the source region, a drain electrode provided on the drain region facing the other major surface of the substrate, and a gate electrode provided on the base region facing the one major surface through a gate insulating layer.

The other objects, features and advantages of this invention will be apparent from the following description taken in conjunction with the accompanying drawings.

BRIEF DESCRIPTION OF THE DRAWINGS

FIGS. 4A to 4I are a series of enlarged cross-sectional views at each process showing one manufacturing method of an insulated gate field effect transistor according to this invention;

FIG. 5 is an enlarged top view showing the pattern of its frame region; and

FIG. 6 is an enlarged top view showing the pattern of its mask layer.

DESCRIPTION OF THE PREFERRED EMBODIMENT

Figure 1:
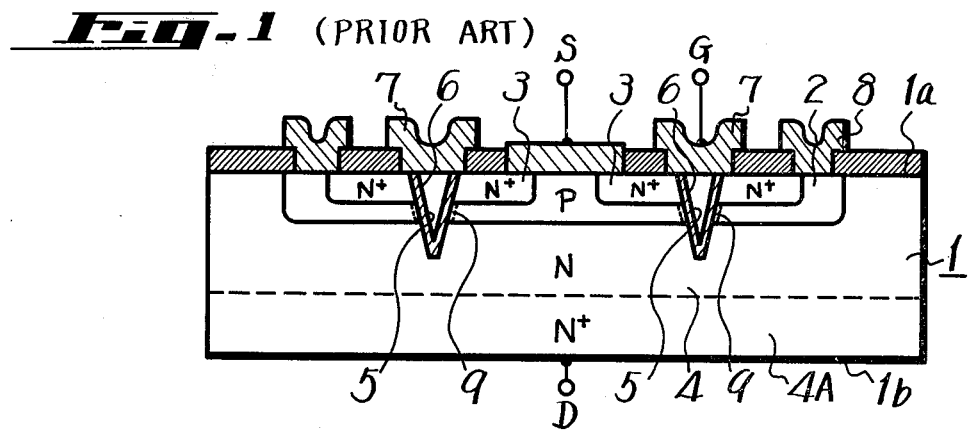
FIG. 1 is a schematic enlarged cross-sectional view showing a prior art MIS-FET having double diffused verticaly type construction.

For the better understanding of this invention, a double diffused vertical type MIS-FET having planar construction will first be described with reference to FIG. 2, in which elements corresponding to those of FIG. 1 are shown by the same reference numerals with their repeated description being omitted. In this case, the base region 2 is formed in comb-shape or mesh-shape and the drain region 4 is formed extending toward the major surface $1a$ to the substrate 1 surrounded by the base region 2 for form portions $4a$, while the source region 3 is formed in the base region 2 by selective diffusion. In this case, however, the selective diffusion of the regions 2 and 3 is carried out with their diffusion windows being made common at their side edges opposing to the portion $4a$ so that the distance between both the regions 2 and 3 is defined by the difference between the diffused depths of both. Then, the gate electrode 7 is deposited on the portion $4a$ extending over the above side edges of both regions 2 and 3 through the gate insulating layer 6. The source region 3 in the base region 2 has formed at its one part a lack portion $3a$ through which one portion of the base region 2 faces the major surface $1a$ of the substrate 1 where the source electrode 8 is deposited extending over the base region 2 as well as the sourcce region 3.

With the MIS-FET constructed as described above, since the groove 5 shown in FIG. 1 is not formed therein, there is no defect appearing in the case of forming the groove 5, while there are other defects such as low reliability and the like. In order to make it understandable, one example of the method of manufacturing the MIS-FET having the construction as shown in FIG. 2 will next be described with reference to FIGS. 3A to 3F, inclusive.

Figure 3A:
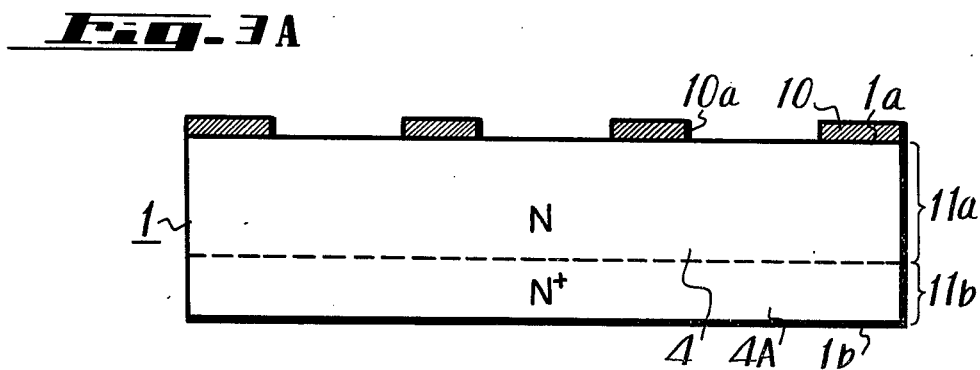
FIGS. 3A to 3F are a series of enlarged cross-sectional views at each process of one manufacturing method of the MIS-FET shown in FIG. 2.

At first, a semiconductor substrate 1 forming, for example, N-type drain region 4 is provided as shown in FIG. 3A. The semiconductor substrate 1 is composed of a semiconductor layer 11a which forms a relatively low impurity concentration region of the drain region 4 at its one major surface 1a side and a high impurity concentration semiconductor layer 11b which forms a high impurity concentration region 4A of the drain region 4 at the other major surface 1b side.

On the major surface 1a of the substrate 1 is deposited an insulating layer 10 which is made of, for example, $SiO_2$ and served as a diffusion mask. Through the insulating layer 10 is formed a diffusion window 10a for diffusing therethrough the base region in, for example, a comb-like pattern.

Figure 3B:
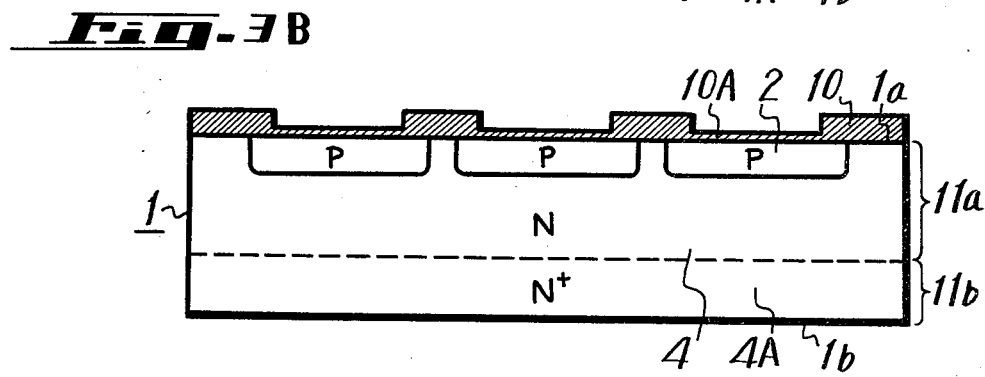

Then, as shown in FIG. 3B, the semiconductor layer 11a of the substrate 1 is selectively diffused with P-type impurities through the diffusion window 10a from the major surface 1a side to form the base region 2. In a case of the above diffusion, the insulating layer 10 made of an oxide film is again formed on the base region 2 to close the diffusion window 10a as indicated by reference numeral 10A.

Figure 3C:
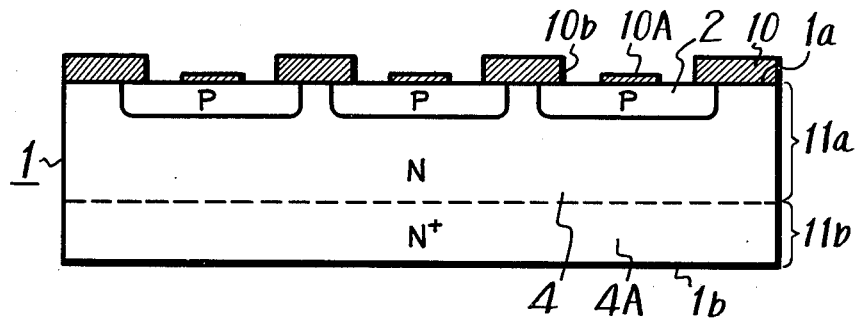

Next, as shown in FIG. 3C, the insulating layer 10 has bored therethrough a diffusion window 10b for formation of a source region.

Figure 3D:
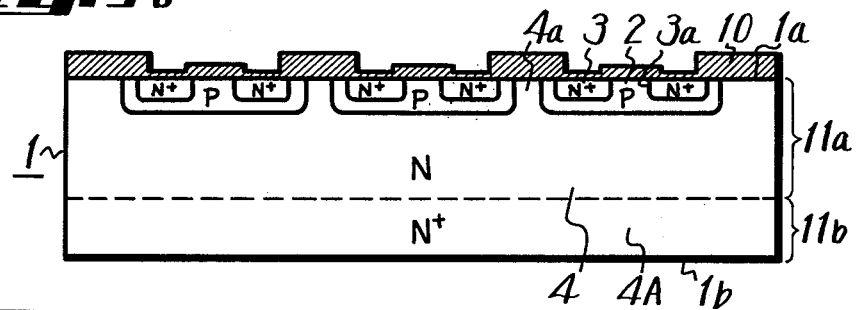

Then, as shown in FIG. 3D, N-type impurities are diffused with high concentration through the diffusion window 10b to form the source region 3. In this case, the side edge of the diffusion window 10b facing the periphery of the base region 2 is formed inalignment with the edge of the diffusion window 10a of the base region 2 shown in FIg. 3A. However, one portion 10A of the insulating layer 10 remains in the window 10b to form the portion 3a at one part of the source region 3 formed in the base region 2. Through this portion 3a is a partial extension of the base region 2 to the major surface 1a.

Figure 3E:
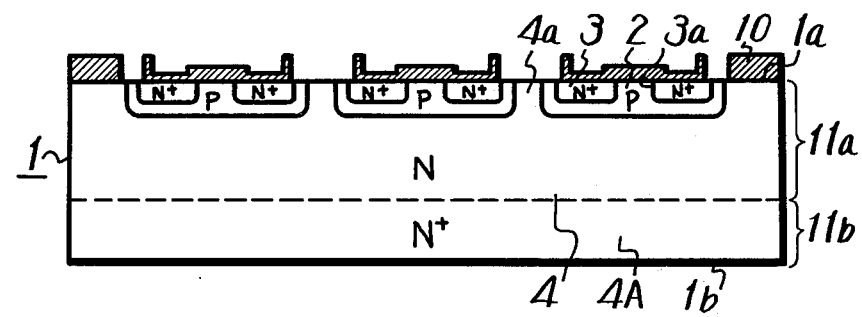

Next, as shown in FIG. 3E, the insulating layer 10 is partially removed on the portion 4a of the drain region 4, which is surrounded by the base region 2 and faced with the major surface 1a of the substrate 1, and on the base region 2 between the portion 4a and the source region 3 opposite to the former.

Figure 3F:
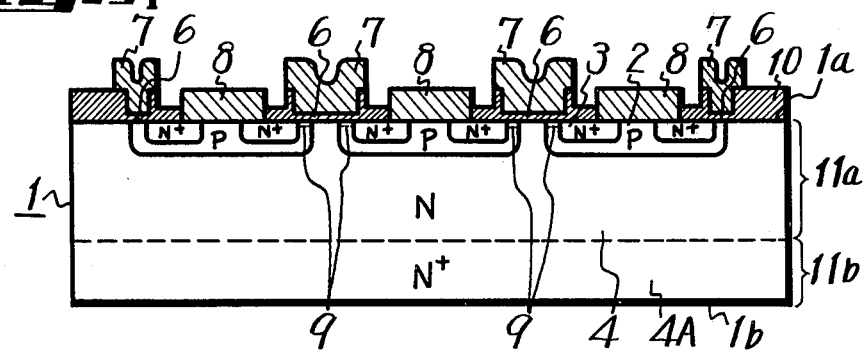

Thereafter, as shown in FIG. 3F, the gate insulating layer 6 is deposited with a required thickness on a portion where the insulating layer 10 is removed and the gate electrode 7 is deposited on this gate insulating layer 6. On the other hand, a source electrode window is formed through the insulating layer 10 extending over the source region 3 and the base region 2 which faces the major surface 1a through the portion 3a, and the source electrode 8 is deposited thereon.

Figure 2:
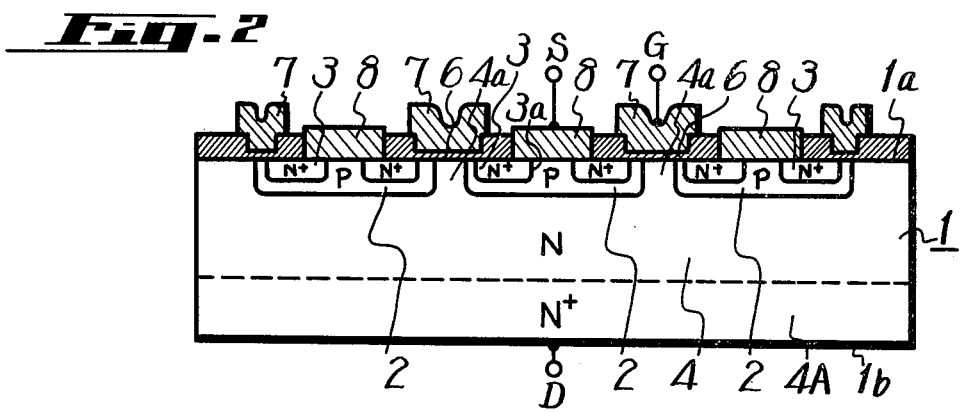
FIG. 2 is a schematic enlarged cross-sectional view of a double diffused vertical type MIS-FET of planar type used for explaining the invention.

The MIS-FET of FIG. 2 is thus constructed as mentioned above. In this case, the channel length of the channel 9 formed between the source region 3 and the portion 4a of the drain region 4 is defined based upon the difference between the diffused depths or lateral depths of the base region 2 and source region 3.

With the above described MIS-FET, however, in a case of diffusing the source region 3, if the thin oxide film 10A appearing upon diffusing the base region 2 as mentioned relative to FIG. 3C is used as a mask to form the source lack portion 3a, since this thin oxide film 10A is apt to produce pinholes therethrough, its masking effect is insufficient so that the portion 3a of the source region 3 is not perfectly formed and hence the base region 2 may sometimes not be completely located beneath the source electrode 8. In such a case, the base region 2 and the source region 3 may no be short-circuited through the source electrode 8 with a low resistance. In order to avoid the defects as described above, it is considered that the insulating layer 10A as the mask for forming the portion 3a of the source region 3 is coated with a thick oxide film for supplementing the thickness of this portion or deposited thereon with a silicon nitride $Si_3N_4$ film or the like before the diffusion of the source region 3. In this case, however, the above working process is troublesome and hence there are drawbacks such that is is difficult to align the side edges of the windows 10a and 10b at the side of defining the channel, the following process of removing $Si_3N_4$ is extremely complicated and the like.

The source electrode 8 deposited over the base region 2 and the source region 3 is normally formed of aluminum Al as in a case of other electrodes. However, Al penetrates through the base region 2 by migration reaching the drain region 4 with the result that the source and drain regions 3 and 4 are substantially short-circuited by the source electrode 8. In addition, the source region 3 has caused therein a defect because of its high concentration and hence abnormal diffusion occurs. As a result, the partial diffusion such as to connect the source region 3 to the drain region 4 through the base region 2 is apt to occur resulting in short-circuit of the source and drain regions.

A description will hereinafter be given on one embodiment of the MIS-FET according to this invention including its manufacturing method with reference to FIGS. 4A to 4I, inclusive.

Figure 4A:
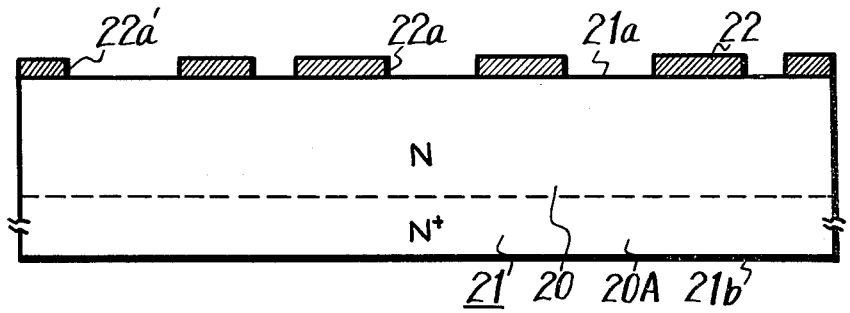

In this example, an N-type MIS-FET is used for the invention. At first, there is provided a semiconductor substrate 21 forming a drain region 20 as shown in FIG. 4A. The semiconductor substrate 21 is composed of semiconductor layer having a relatively low impurity concentration at the side of its major surface 21a and a semiconductor layer of high impurity concentration forming a high-dense drain region 20A at the side of the other major surface 21b. The semiconductor substrate 21 can be formed in such a manner that an N-type high-dense substrate forming a region 20A has epitaxially grown thereon an N-type semiconductor layer having a relatively low impurity concentration with a thickness of, for example, 15 $\mu$m. Then, the substrate 21 has deposited thereon an insulating layer 22 made of $SiO_2$ or the like which serves as a diffusion mask. Next, the insulating layer 22 on the major surface 21a is subjected to photoetching process to form a base diffusion window 22a in a mesh-like or lattice-like pattern by way of example. At the same time as the formation of the window 22a another diffusion window 22a' is provided laterally of the former.

Figure 4B:
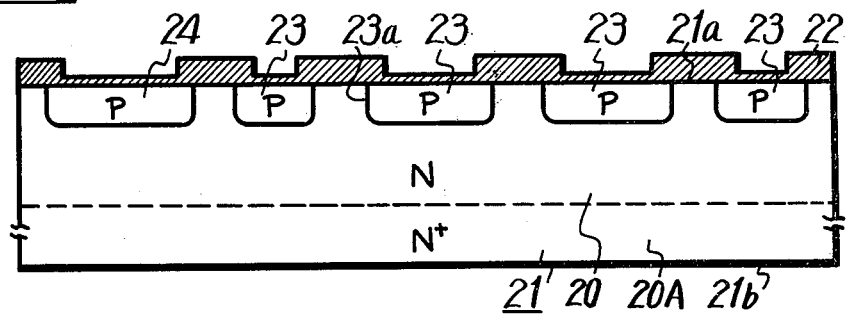

P-type impurities are selectively diffused through these windows 22a and 22a' to form a frame region 23 for the base region and an anode region 24 for the protective diode. respectively, with a relatively high concentration, for example, with a surface concentration of an order of $10^{18}/cm^3$ or more as shown in FIG. 4B. The frame region 23 can be formed in a mesh-like pattern having a plurality of through holes 23a as shown in FIG. 5 by its partial enlarged top view.

Figure 4C:
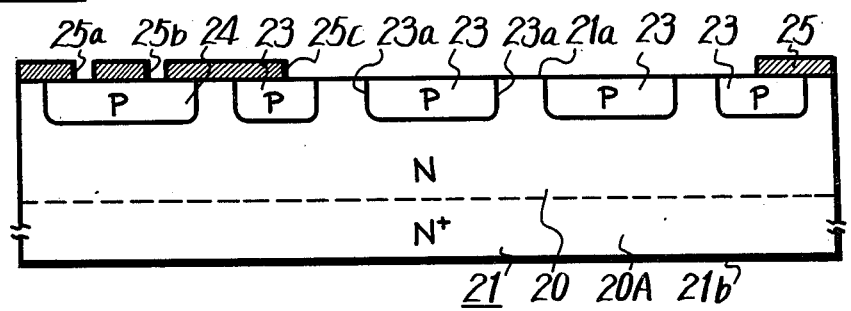

Next, as shown in FIG. 4C, with the insulating layer 22 and an oxide layer produced upon diffusion of the regions 23 and 24 being removed, the substrate 21 has deposited on its surface 21a a thick insulating layer 25 such as $SiO_2$, which can be served as a mask for selective doping of impurities to be described later. The layer 25 is subjected to photoetching process to form a pair of windows 25a and 25b on the region 24 and a window 25c over each hole 23a of the frame region 23.

Figure 4D:
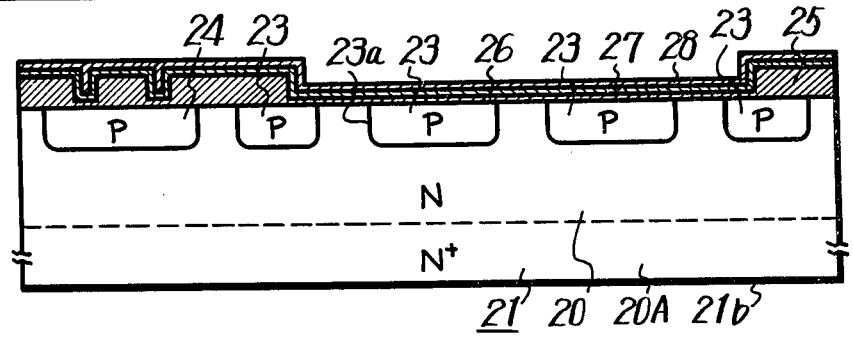

Then, as shown in FIG. 4D, the respective parts on the surface 21a of the substrate 21 exposed through the windows 25a, 25b and 25c are entirely deposited thereon with a mask layer having oxidation resistance, or masking effect for oxygen, for example, a silicon oxide $Si_3N_4$ layer 27 through, for exmaple, a $SiO_2$ layer 26. A mask layer 28 such as $SiO_2$, which can be served as a mask for selective etching to the mask layer 27, is further deposited thereon.

Figure 4E:
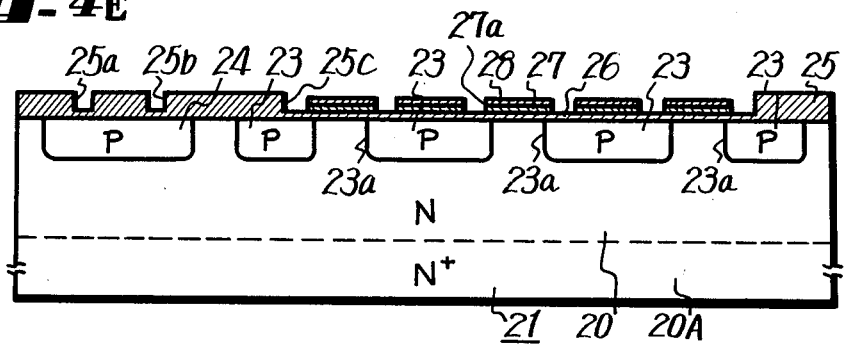

Next, the $Si_3N_4$ layer 27 is partially removed by etching as shown in FIG. 4E. In other words, the layer 28 is subjected to well-known photoetching process with a required pattern and then used as a mask for etching the $Si_3N_4$ layer 27 underneath the former.

FIG. 6 is an enlarged plan view showing the pattern of the thick insulating layer 25 and the mask layer 28, in which the window 25c of the thick insulating layer 25 is arranged so that its edge portion may be located inside the frame region 23 spaced from its outer periphery by a required width W and spaced from each hole 23a of the frame region 23 by a required distance d. Further, the mask layer 27 is provided with, for example, a square ring-shaped window 27a surrounding the periphery of each hole 23a of the frame region 23.

Figure 4F:
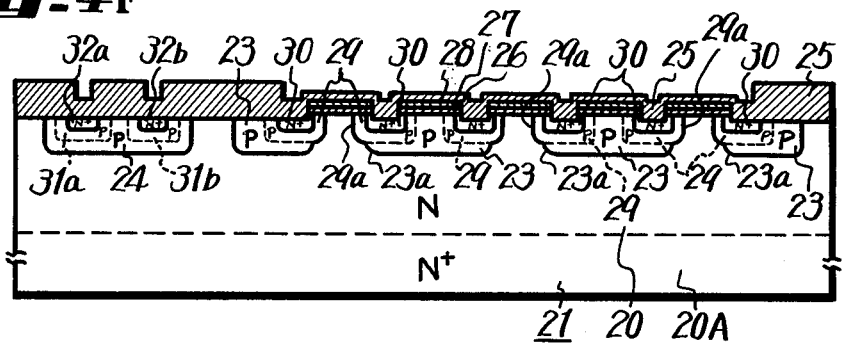

Then, as shown in FIG. 4F, with the thick insulating layer 25 and the mask layer 27 being used as a common mask, P-type impurities and N-type impurities are selectively doped through the thin $SiO_2$ layer 26 by ion implantation and thereafter its thermal treatment is carried out in steam. Thus, an annular P-type base region 29 is formed through each window 27a of the mask layer 27 within the window 25c of the thick insulating layer 25, and a source region 30 shallower than the former is further formed thereon. Besides, at the same time as the formation of these regions 29 and 30, P-type regions 31a and 31b and N-tupe cathode regions 32a and 32b are formed on the region 24 through the windows 25a and 25b of the thick insulating layer 25. In this case, the base region 29 is formed extending from the frame region 23 over each hole 23a thereof, and the mask layer 27 establishes the dimension and position of its window 27a so that the hole 23a may form at its center a portion having no region 29, or a through hole 29a. The concentration of the base region 29 is selecgted to be sufficiently low as compared with that of the frame region 23, for example, $10^{15}$ to $10^{17}/cm^3$, while the concentration of the source region 30 formed on the former is selected to be in an order of $10^{20}/cm^3$. Since the impurity concentration of the base region 29 is selected to be low as mentioned above, the concentration of the regions 31a and 31b, which are formed at the same time as the formation of this region 29, is determined by the high concentration of the anode region 24 and hence the concentration of the above anode region 24 is substantially little affected by that of the regions 31a and 31b. In the above described example, impurities are doped by ion implantation. In this case, impurity doping can be performed through the thin $SiO_2$ layer 26 by properly selecting striking energy of the impurity ion. On the contrary, when the impurity dope is formed by the diffusion method, the $SiO_2$ layer 26 inside the respective windows 25a, 25b and 27a removed in advance.

The depth of the frame region 23 can be selected to be, for example, 5 - 7 $\mu$m, that of the base region 29 to be 2 - 3 $\mu$m and that of the source region 30 to about 1 $\mu$m, respectively.

Figure 4G:
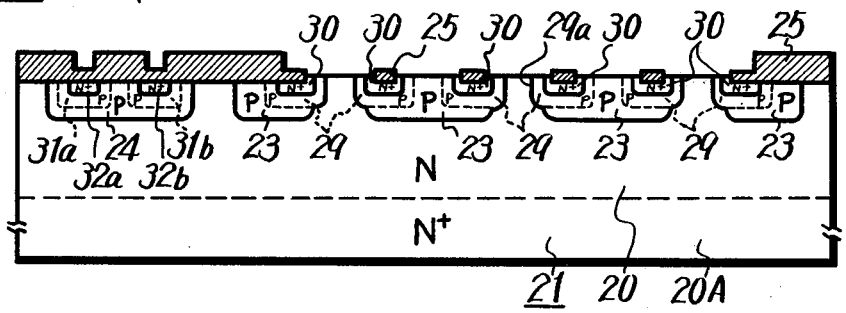

Thereafter, the mask layers 27 and 26 are removed by etching as shown in FIG. 4G. In this case, since the thick oxide layer 25 has been formed at the portion where the mask layer 27 is not formed during the thermal treatment of FIG. 4F, if the etching of the mask layer 26 made of thin $SiO_2$ beneath the mask layer 27 is stopped upon finishing, the thick oxide layer, or the insulating layer 25, remains and the surface between respective base regions is exposed to the outside.

Figure 4H:
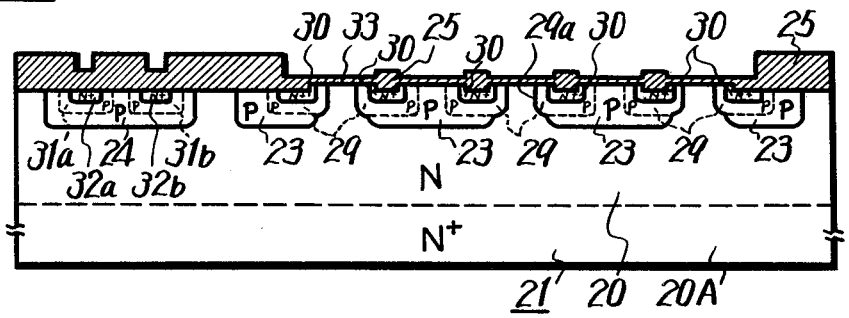

Next, as shown in FIG. 4H the exposed surface is coated with a gate insulating layer 33 made of, for example, $SiO_2$ with a required thickness.

Thereafter, as shown in FIG. 4I a gate electrode 34 is formed by deposition on the gate insulating layer 33, while the insulating layer 33 on the base frame region 23, particularly on the portion between the source regions 30 is removed and the thus removed portion is deposited thereon with a source electrode 35 in an ohmic contact therewith on the source regions and the frame region. Further, both the cathode regions 32a and 32b are respectively deposited thereon with electrodes 36a and 36b. Thus, one electrode 36b is connected to the gate electrode 34 while the other electrode 36a is electrically connected to the source electrode 35. In addition, a drain electrode 37 is deposited on the surface 21b of the high concentration region 20A of the drain region 20 or the substrate 1.

Thus, there can be obtained an insulated gate field effect transistor 38 according to this invention. In other words, the drain region 20 is formed extending to both of the major surfaces 21a and 21b of the semiconductor substrate 21, the high concentration frame region 23 is formed facing one major surface 21a of the substrate 21 and also a base region 29 connected to this frame region 23 and faced to the major surface 21a is formed extending into the hole 23a of the frame region 23, a PN junction J is formed between the drain region 20 and the base region 29 at its portion extending into the hole 23a, and the source region 30 is formed on the base region 29 as if being surrounded thereby, thus the MIS-FET being constructed. The MIS-FET according to this invention has a so-called double diffused type construction such that the length L of surface channel (See FIG. 4I) of the base region 29 between the source and drain regions 30 and 20, both being faced to the major surface 21a, is defined by the difference between the lateral depths of the regions 30 and 29, and this channel length L can be made small such as about 0.5 $\mu$m. This MIS-FET also has a vertical configuration. In addition to the above MIS-FET, the substrate 21 is provided with two cathode regions 32a and 32b together with the common anode region 24, which are connected in a back-to-back manner to form protective diodes $D_s$.

As described above, according to this invention no groove is formed irrespective of its double diffused verticaltype construction so that the previously mentioned drawback caused by the formation of groove can be avoided. Further, since the high concentration frame region 23 exists under the source electrode 35, the electric resistance of the short-circuited portion between source and base can be made quite small.

Between the source electrode 35 and the drain region 20 there exists the frame region 23 having a relatively great thickness and hence there is no possibility that the short-circuit between source and drain regions occurs by the migration of the source electrode 35.

The frame region 23 is desirably arranged extending over the range as wide as possible under the source region 30. With the above arrangement, the frame region 23 exists within the greater area between the source region 30 and the drain region 20, so that even though abnormal diffusion occurs in the source region 30, the short-circuit between source and drain regions can be effectively avoided.

The invention is also advantageous in that the MISFET can be formed together with its protective diodes $D_s$ without increasing the number of process.

It will be apparent that a number of changes and variations can be effected without departing from the scope of the novel concepts of the present invention.

I claim as my invention:

1. An insulated gate field effect transistor comprising:
    a semiconductor substrate;
    a drain region in said substrate of a first conductivity type facing both of the major surfaces of said semiconductor substrate;
    a frame region of a second conductivity type facing one of said major surfaces of said semiconductor substrate;
    a base region of the second conductivity type facing said one major surface and connected to said frame region, said base region forming a PN junction with said drain region;
    a source region of the first conductivity type facing said one major surface and formed in said base region whereby said source region is surrounded by said base region;
    a source electrode on said frame region and said source region;
    a drain electrode on said drain region facing the other of said major surfaces of said substrate;
    a gate insulating layer; and
    a gate electrode on said gate insulating layer facing said one major surface through said gate insulating layer.

2. An insulated gate field effect transistor as set forth in claim 1, wherein said frame region is deeper than said base region.

3. An insulated gate field effect transistor as set forth in claim 1, wherein said frame region is located extending under said source region.

4. An insulated gate field effect transistor as set forth in claim 1, wherein said frame region has higher impurity concentration than that of said base region.

* * * * *